(12) United States Patent
Ando et al.

(10) Patent No.: US 9,276,191 B2
(45) Date of Patent: Mar. 1, 2016

(54) PIEZOELECTRIC DEVICE

(71) Applicants:MURATA MANUFACTURING CO., LTD., Nagaokakyo-shi, Kyoto-fu (JP); A School Corporation Kansai University, Suita-shi, Osaka (JP)

(72) Inventors: Masamichi Ando, Nagaokakyo (JP); Yoshiro Tajitsu, Suita (JP); Mitsunobu Yoshida, Sodegaura (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 420 days.

(21) Appl. No.: 13/721,098

(22) Filed: Dec. 20, 2012

(65) Prior Publication Data

US 2013/0108061 A1    May 2, 2013

Related U.S. Application Data

(63) Continuation of application No. PCT/JP2011/069164, filed on Aug. 25, 2011.

(30) Foreign Application Priority Data

Aug. 26, 2010  (JP) ................................. 2010-189498

(51) Int. Cl.
*H04R 25/00* (2006.01)
*H01L 41/04* (2006.01)
(Continued)

(52) U.S. Cl.
CPC ............ *H01L 41/042* (2013.01); *G06F 3/0414* (2013.01); *G06F 3/0433* (2013.01); *H01L 41/0973* (2013.01); *H01L 41/193* (2013.01); *H04R 17/00* (2013.01)

(58) Field of Classification Search
CPC ........ G06F 3/041; G06F 3/0416; H03G 5/165

USPC .............................. 381/173, 55, 103, 164, 190
See application file for complete search history.

(56) References Cited

U.S. PATENT DOCUMENTS 4,761,242 A * 8/1988 Suzuki et al. ............ 252/62.9 R
4,866,326 A   9/1989 Niikawa et al.
(Continued)

FOREIGN PATENT DOCUMENTS

CN         87207028 U    12/1987
CN          1159573 A     9/1997
(Continued)

OTHER PUBLICATIONS

International Search Report and Written Opinion issued in PCT/JP2011/069164, mailed Dec. 6, 2011.

*Primary Examiner* — Alexander Jamal
(74) *Attorney, Agent, or Firm* — Arent Fox LLP (57) ABSTRACT

A piezoelectric device is provided with a sound source IC, an amplifier for amplifying a sound source from the sound source IC, a piezoelectric speaker for generating sound based on a drive signal from amplifier, an MPU for performing a predetermined control process on the drive signal, a memory for storing temperature dependency information about the piezoelectric constant ($d_{14}$) and Young's modulus E of the piezoelectric speaker, and a temperature sensor for detecting an ambient temperature. MPU has correcting unit, compares a detected result of the temperature sensor with the temperature dependency information, and performs temperature correction on the drive signal serving as an acoustic signal based on a compared result. The piezoelectric speaker outputs the acoustic signal temperature-corrected by correcting unit. Thus, it becomes possible to realize various piezoelectric devices, such as a piezoelectric speaker system, capable of preventing various input information from fluctuating even when there is a change in usage environmental temperature.

7 Claims, 9 Drawing Sheets

(51) Int. Cl.
*G06F 3/043* (2006.01)
*H01L 41/09* (2006.01)
*H01L 41/193* (2006.01)
*H04R 17/00* (2006.01)
*G06F 3/041* (2006.01)

(56) References Cited

U.S. PATENT DOCUMENTS

| | | |
|---|---|---|
| 5,834,650 A | 11/1998 | Kim |
| 6,400,062 B1 | 6/2002 | Gallmeyer et al. |
| 7,092,536 B1 * | 8/2006 | Hutt et al. ................ 381/96 |
| 7,988,351 B2 | 8/2011 | Gabl et al. |
| 2001/0026625 A1 * | 10/2001 | Azima et al. ................ 381/152 |
| 2004/0246239 A1 * | 12/2004 | Knowles et al. ............ 345/177 |
| 2007/0159028 A1 * | 7/2007 | Nagaya et al. ............. 310/358 |
| 2007/0251321 A1 | 11/2007 | Fritze et al. |
| 2008/0298427 A1 | 12/2008 | Gabl et al. |
| 2009/0066673 A1 * | 3/2009 | Molne et al. ................ 345/178 |
| 2011/0281070 A1 * | 11/2011 | Mittal et al. ................ 428/142 |
| 2012/0014484 A1 * | 1/2012 | Ameti et al. ................ 375/345 |
| 2013/0178963 A1 * | 7/2013 | Bergmann .................... 700/94 |

FOREIGN PATENT DOCUMENTS

| | | |
|---|---|---|
| CN | 101258676 A | 9/2008 |
| JP | 63204674 A | 8/1988 |
| JP | 5-061592 | 3/1993 |
| JP | 2001314092 A | 11/2001 |
| JP | 2003244792 | 8/2003 |
| JP | 2009125206 A | 6/2009 |

* cited by examiner

PIEZOELECTRIC DEVICE

This is a continuation of application Serial Number PCT/JP2011/069164, filed Aug. 25, 2011, the entire contents of which are incorporated herein by reference.

TECHNICAL FIELD

The present invention relates to a piezoelectric device, and more particularly, to a piezoelectric device such as a piezoelectric speaker system or a touch input system using a piezoelectric polymer material as an element material.

BACKGROUND ART

Recently, mobile information terminals such as a mobile phone or PDA (Personal Digital Assistance) have been required to be thinner and light in weight, and as a result, a speaker mounted in this mobile information terminal is required to be set in a small space.

Since a piezoelectric polymer material can be thinned into a film shape, it can be incorporated in the small space. In addition, a thin film-shaped piezoelectric film has flexibility and can show high piezoelectricity, so that a bimorph type or unimorph type piezoelectric element can be obtained by forming an electrode on a surface of the piezoelectric film. Therefore, the piezoelectric polymer material is also expected to serve as a speaker material for the mobile information terminal.

For example, Japanese Patent Laying-Open No. 2003-244792 (PTL 1) discloses a piezoelectric film speaker which includes a piezoelectric film diaphragm formed by transparent electrodes on front and back surfaces of a transparent and flexible piezoelectric film, and set on a display screen in a curved manner by supporting the piezoelectric film diaphragm on a casing of the mobile information terminal.

According to the PTL 1, a flexible piezoelectric film formed of polyvinylidene difluoride (hereinafter, referred to as "PVDF") is used, so that the device can be low in profile and light in weight, the display screen can be large, and hearing performance is improved.

In addition, recently, in tandem with the development of a technique for a low-profile display, research and development have been increasingly carried out regarding a touch input system using a touch panel serving as an input interface of the mobile information terminal, mobile game machine, or mobile music player.

It is conventionally known that this kind of touch input system employs an ultrasonic method in which a surface acoustic wave technique is used, and a reflection array is formed along a side of a rectangular glass base material.

However, even when position information and press information on a plane are inputted with a finger or pen head at the same time according to the touch input system employing the ultrasonic method, there arises a problem that it is low in touch pressure resolution, poor in touch feel, and vulnerable to external impact because its surface is formed of the glass base material.

As opposed to the above, the piezoelectric polymer material has high piezoelectricity and flexibility, and it can be thinned into the film shape as described above, so that it is also expected to serve as the touch panel material.

In addition, Japanese Patent Laying-Open No. 5-61592 (PTL 2) discloses a touch input system configured by overlapping a flexible touch panel on a planar pressure sensitive sensor so as to adhere them to each other.

According to the PTL 2, a flexible piezoelectric film formed of polyester is arranged on the pressure sensitive sensor to obtain position information with the piezoelectric film, and obtain press information with the pressure sensitive sensor.

SUMMARY OF INVENTION

Technical Problem

Recently, a small-size liquid crystal television which can be used in a bathroom or kitchen has been attracting attention. In addition, a transparent speaker can be realized by forming transparent electrodes on both main surfaces of a highly transparent piezoelectric film. Therefore, when such transparent speaker is mounted in the small-size liquid crystal television, a television having a small frame and not requiring a sound transmission hole can be realized. Since waterproof performance is especially required in the bathroom or kitchen, a television having no sound transmission hole is preferable.

Since the flexible piezoelectric polymer material such as PVDF is used for the piezoelectric film in the PTL 1, there arises the problem that acoustic characteristics such as a sound pressure level (sound volume) and frequency characteristics (sound quality) decrease depending on the ambient temperature at a place where the piezoelectric speaker is present.

That is, even when the same voltage is supplied to the piezoelectric speaker, a user could not hear the sound with a desired sound volume because when the piezoelectric constant fluctuates due to a temperature change, the sound volume also fluctuates together with the fluctuation of the piezoelectric constant. In addition, when the Young's modulus of the piezoelectric film fluctuates due to the temperature change and flexibility of the piezoelectric film changes, there is a change in the reproduced frequency band generated from the piezoelectric speaker.

The ambient temperature is high in the bathroom or kitchen, compared with a normal atmosphere in many cases. For example, in the case where the bathroom is used as a simplified sauna, or the case where the television is arranged in the vicinity of a stove in the kitchen, the piezoelectric speaker could be exposed to the high-temperature atmosphere at 70 to 80° C. in a short time. When the piezoelectric speaker is driven in such high-temperature atmosphere, the sound volume largely fluctuates, the reproduced frequency band changes, and the sound quality also changes, due to temperature dependency of the piezoelectric constant and the Young's modulus.

Thus, when the piezoelectric constant and the Young's modulus of the piezoelectric element change depending on the ambient temperature in the PTL 1 system, there arises a problem that the acoustic characteristics deteriorate, so that the user cannot hear the sound with the desired sound volume and sound quality especially in the high-temperature atmosphere.

In addition, when the touch panel is pressed with the finger or pen, according to the conventional touch input system disclosed in the PTL 2, the piezoelectric film deflects and a micro voltage is generated.

When the piezoelectric constant and the Young's modulus change depending on the temperature, a problem is that even when the specific position of the touch panel is pressed with the same pressing force, the sensing performance becomes low because the generated voltage and the deflection amount differ between a normal temperature and a high temperature, so that the position information and the press information cannot be correctly detected, causing a detection error.

The present invention was made in view of such circumstances, and it is an object to provide a piezoelectric device capable of preventing various input information from fluctuating even when there is a change in usage environmental temperature.

Solution to Problem

In order to attain the above object, a piezoelectric device according to the present invention includes: a piezoelectric element including at least one piezoelectric body formed in such a manner that electrodes are formed on both main surfaces of a piezoelectric film made of a piezoelectric polymer material; inputting unit for inputting predetermined information to the piezoelectric element; storing unit for storing each temperature dependency information about the amount of displacement when a voltage is applied and the amount of deflection when a stress is applied in the piezoelectric element; temperature detecting unit for detecting the ambient temperature; and correcting unit for correcting the input information of the inputting unit, based on a detected result of the temperature detecting unit and the temperature dependency information.

In addition, it is preferable that the inputting unit according to the piezoelectric device in the present invention includes a sound source unit accumulating a sound source, the input information is an acoustic signal, and the correcting unit corrects the acoustic signal, based on the detected result of the temperature detecting unit and the temperature dependency information.

In addition, it is preferable that the inputting unit according to the piezoelectric device in the present invention includes a pressing unit for applying pressure to a specific position of the piezoelectric element, the input information includes position information and pressure information, and the correcting unit corrects the position information and the press information, based on the detected result of the temperature detecting unit and each temperature dependency information.

Also, a piezoelectric device according to the present invention includes: a piezoelectric element including at least one piezoelectric body formed in such a manner that electrodes are formed on both main surfaces of a piezoelectric film made of a piezoelectric polymer material; inputting unit for inputting predetermined information to the piezoelectric element; storing unit for storing the temperature dependency information about the amount of displacement when a voltage is applied, the amount of deflection when a stress is applied, and electrostatic capacitance in the piezoelectric element; measuring unit for measuring the electrostatic capacitance of the piezoelectric element; and correcting unit for correcting the input information, based on each temperature dependency information and the electrostatic capacitance measured by the measuring unit.

In addition it is preferable that the inputting unit according to the piezoelectric device in the present invention includes a sound source unit, the input information is an acoustic signal, and the correcting unit detects the temperature of the piezoelectric element based on a measured result of the measuring unit, and the temperature dependency information of the electrostatic capacitance, and corrects the acoustic signal based on the detected temperature and the temperature dependency information about the amount of displacement when the voltage is applied, and the amount of deflection when the stress is applied, in the piezoelectric element.

Also, it is preferable that the inputting unit according to the piezoelectric device in the present invention includes a pressing unit for putting pressure on a specific position of the piezoelectric element, the input information includes position information and pressure information, and the correcting unit detects the temperature of the piezoelectric element based on a measured result of the measuring unit, and the temperature dependency information of the electrostatic capacitance, and corrects the position information and the press information based on the detected temperature and the temperature dependency information of the amount of displacement when the voltage is applied and the amount of deflection when the stress is applied in the piezoelectric element.

Furthermore, it is preferable that the piezoelectric device in the present invention includes a switching unit for switching an execution mode of the measuring unit and a non-execution mode of the measuring unit.

According to the piezoelectric device in the present invention, it is in addition preferable that the piezoelectric element includes a piezoelectric speaker.

Also, it is preferable according to the piezoelectric device in the present invention that the piezoelectric element is configured in such a manner that an electrode formed on at least one main surface is divided into a plurality of regions.

It is also preferable according to the piezoelectric device in the present invention that the piezoelectric element is a touch panel.

In addition, it is preferable that the piezoelectric polymer material is poly-lactic acid according to the piezoelectric device in the present invention.

Advantageous Effects of Invention

A piezoelectric device according to the present invention includes the piezoelectric element including at least one piezoelectric body formed in such a manner that electrodes are formed on both main surfaces of a piezoelectric film made of the piezoelectric polymer material, an inputting unit for inputting the predetermined information to the piezoelectric element, a storing unit for storing temperature dependency information about the amount of displacement when the voltage is applied and the amount of deflection when the stress is applied in the piezoelectric element, a temperature detecting unit for detecting the ambient temperature, and a correcting unit for correcting the input information of the inputting unit, based on the detected result of the temperature detecting unit and the temperature dependency information, so that even when the usage environmental temperature changes, the various input information can be prevented from fluctuating.

In addition, the inputting unit includes a sound source unit accumulating a sound source, the input information is the acoustic signal, and the correcting unit corrects the acoustic signal based on the detected result of the temperature detecting unit and the temperature dependency information, so that even when the amount of displacement of the piezoelectric element due to the voltage application fluctuates because of the temperature change, a temperature correction can be performed on the sound volume, so that the sound volume can be prevented from fluctuating as much as possible even when the temperature change is produced. Further, even when the amount of deflection of the piezoelectric element due to the stress application fluctuates because of the temperature change, the temperature correction can be performed on the frequency characteristics, so that the fluctuation in sound quality due to the temperature rise can be prevented as much as possible.

Thus, the acoustic characteristics according to the above piezoelectric device can be prevented from deteriorating even under a high-temperature atmosphere such as in the bathroom or kitchen, so that a user can hear the sound with the desired sound volume and with the desired sound quality. That is, even when the usage environmental temperature changes, it becomes possible to realize the small-size and high-quality piezoelectric speaker system in which the sound volume and the sound quality are prevented from fluctuating.

In addition, the inputting unit includes the pressing unit for pressing the specific position of the piezoelectric element, the input information includes the position information and the pressure information, and the correcting unit detects the temperature of the piezoelectric element based on the measured result of the measuring unit and the electrostatic capacitance temperature dependency information, and corrects the position information and the press information based on the detected temperature and the temperature dependency information of the amount of displacement when the voltage is applied and the amount of deflection when the stress is applied, so that even when the generated voltage and the amount of deflection of the piezoelectric element due to pressing change depending on the change in environmental temperature, the desired sensing performance can be obtained, and the detection error can be avoided as much as possible.

According to the piezoelectric device described above, even when the usage environmental temperature changes, the correct position information and press information can be obtained, so that it becomes possible to realize the high-performance touch input system in which the sensing performance is preferable and reliability is improved.

In addition, the piezoelectric device is provided with the storing unit for storing temperature dependency information about the amount of displacement when the voltage is applied, the amount of deflection when the stress is applied, and the electrostatic capacitance in the piezoelectric element, the measuring unit for measuring the electrostatic capacitance of the piezoelectric element, and correcting unit for correcting the input information based on each temperature dependency information and the electrostatic capacitance measured by the measuring unit, so that even when the temperature detecting unit is not provided, the temperature correction can be performed on the sound volume and the sound quality of the piezoelectric speaker, and the position information and the press information of the touch panel at low cost, and as a result, it becomes possible to obtain various piezoelectric devices which are high in performance, high in quality, and superior in reliability.

The piezoelectric device can include a switch for switching the execution mode of the measuring unit and the non-execution mode of the measuring unit, so that the output of the drive signal to the piezoelectric element can be easily controlled.

In addition, when the piezoelectric polymer material is poly-lactic acid, time degradation of the piezoelectric constant due to a depolarizing action is not generated, and it becomes possible to realize desired piezoelectric devices preferable in transparency and strength.

DESCRIPTION OF EMBODIMENTS

Hereinafter, embodiments of the present invention will be described in detail with reference to the drawings.

Figure 1:
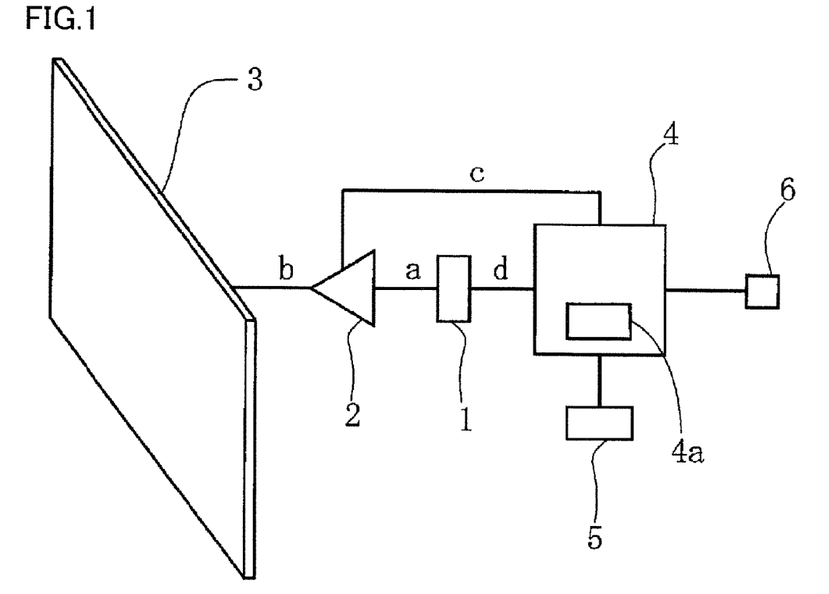
FIG. 1 is a system configuration diagram showing one example of a piezoelectric speaker system as one embodiment (first embodiment) of a piezoelectric device according to the present invention.

FIG. 1 is a system configuration diagram showing one example of a piezoelectric speaker system as one embodiment (first embodiment) of a piezoelectric device.

This piezoelectric speaker system includes a sound source IC (inputting unit) 1, an amplifier 2 for amplifying a sound source outputted from sound source IC 1, a piezoelectric speaker (piezoelectric element) 3 for generating sound based on a drive signal (acoustic signal) supplied from amplifier 2, a microprocessor unit (hereinafter, referred to as "MPU") 4 for controlling sound source IC 1 and amplifier 2, a memory 5 (storing unit) for storing temperature dependency information specific to piezoelectric speaker 3 and an arithmetic program, and a temperature sensor 6 (temperature detecting unit) for detecting the ambient temperature while the system is driven.

Sound source IC 1 converts an inputted sound source signal to the acoustic signal (such as music or sound) for driving the speaker. As for the sound source signal, there is a case where it is accumulated in a memory incorporated in MPU 4, a case where it is directly delivered through an electric telecommunication line such as the internet, and a case where broadcasting airwaves represented by digital broadcasting is received by a tuner and demodulated. In addition, the sound source signal is not necessarily a digital signal, and may be an analog signal.

Figure 2:
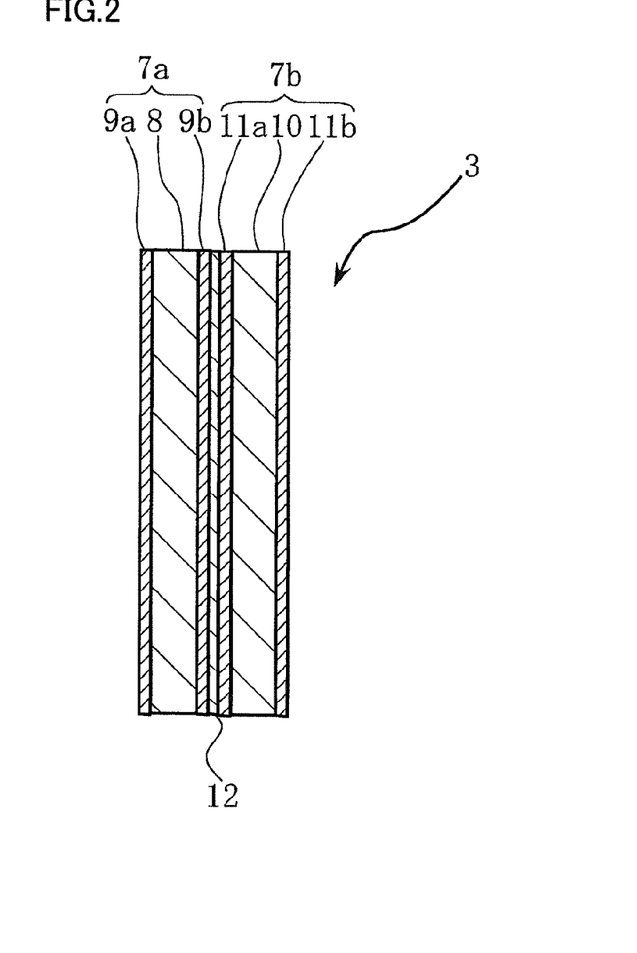
FIG. 2 is a cross-sectional view schematically showing a piezoelectric speaker serving as a piezoelectric element.

FIG. 2 is a cross-sectional view schematically showing piezoelectric speaker 3.

A surface layer thereof is covered with a protective material such as a protective film in general, but the protective material is omitted in FIG. 2.

Piezoelectric speaker 3 has a bimorph structure including two attached piezoelectric bodies (a first piezoelectric body 7a, and a second piezoelectric body 7b). That is, first piezoelectric body 7a is configured such that electrodes 9a and 9b are formed on both main surfaces of a piezoelectric film 8, second piezoelectric body 7b is configured such that electrodes 11a and 11b are formed on both main surfaces of a piezoelectric film 10, and first piezoelectric body 7a and second piezoelectric body 7b are bonded with a bonding layer 12 interposed therebetween.

FIG. 2 shows one example of piezoelectric speaker 3, but is not limited to this, and it may have a unimorph structure in which a PET film and only first piezoelectric body 7a are combined, or a bimorph structure in which the PET film is interposed as an intermediate layer between first piezoelectric body 7a and second piezoelectric body 7b.

Each of piezoelectric films 8 and 10 is made of a piezoelectric polymer material, and each of them is formed into a film shape having a thickness of 30 to 150 μm.

The piezoelectric polymer material is not limited to any specific material as long as it has flexibility and high piezoelectrocity, and can be formed into a desired film shape, but it is preferable to use a piezoelectric polymer material containing, as a main component, poly-lactic acid (hereinafter, referred to as "PLA") for following reasons.

PLA is a condensation polymer including monomers of lactic acid, and lactic acid has an asymmetric carbon, so that there is are enantiomers, namely the L isomer and D isomer. When L isomers are polymerized, poly-L-lactic acid (hereinafter, referred to as "PLLA") is provided, and has a left-handed helix structure. In addition, when D isomers are polymerized, poly-D-lactic acid (hereinafter, referred to as "PDLA") is provided, and has a right-handed helix structure.

PLA is generated through fermentation process where lactic-acid bacilli are acted on starch obtained from corn. In this process, PLLA is almost exclusively generated, so that a material which is usually distributed to the market includes PLLA, and contains a tiny amount of PDLA as an impurity.

When PLLA is uniaxially elongated, the main chain of PLLA can be oriented in an elongation direction. It is known that PLLA whose crystallinity has been improved through a heat treatment after the uniaxial elongation shows very high piezoelectricity as a polymer. In addition, PLLA shows the piezoelectricity due to the helix structure of the main chain, unlike the other ferroelectric piezoelectric polymer material such as PVDF, so that it is not necessary to perform a polarization treatment, and as a result, a time degradation in piezoelectric constant due to a depolarizing action is not generated. Furthermore, PLLA has the same degree of transparency and strength as those of an acrylic resin.

For the above reasons, it is especially preferable to use the piezoelectric polymer material containing PLLA as its main component in view of realizing the desired transparent piezoelectric speaker.

In addition, the electrode material used for electrodes 9a, 9b, 11a, and 11b is not limited to a specific one, but it is preferable to use a transparent electrode material such as indium tin oxide (ITO), zinc oxide, or indium oxide-zinc oxide, in view of realizing the transparent piezoelectric speaker. In addition, an organic electrode containing polythiophene as a main component may be used. The method for forming the electrode is not limited to a specific one, and it may be any method, such as vacuum deposition method, sputtering method, plating method, coating, or foiling.

In addition, bonding layer 12 may be formed of a transparent material of a bonding agent used in a laminated film.

Figure 3:
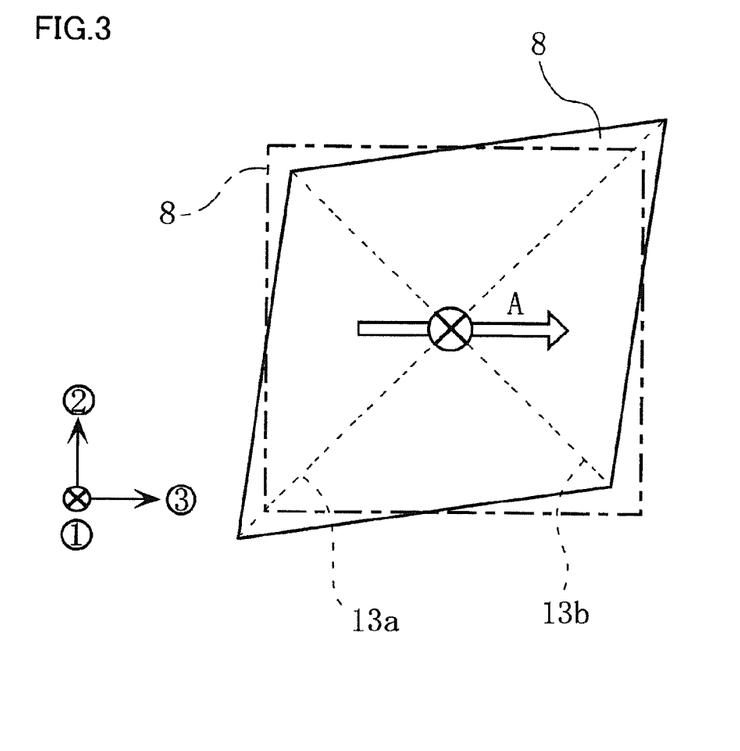
FIG. 3 is a view showing one example of a piezoelectric phenomenon of a piezoelectric film.
Figure 4:
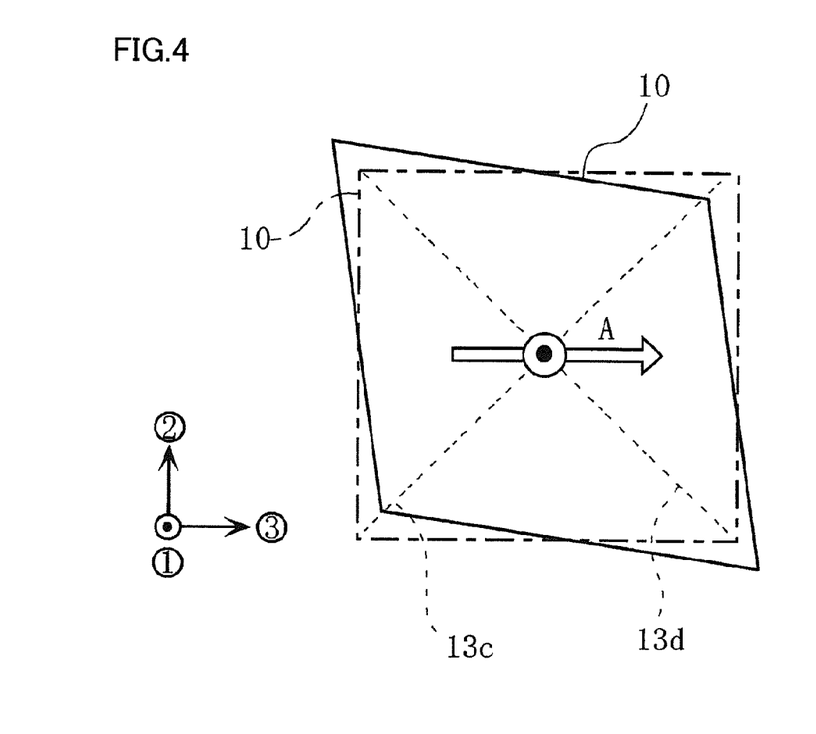
FIG. 4 is a view showing another example of a piezoelectric phenomenon of a piezoelectric film.

FIGS. 3 and 4 are views showing piezoelectric phenomena when piezoelectric films 8 and 10 are formed of PLLA.

In the drawing, a normal direction with respect to a main surface of the piezoelectric film (direction vertical to a sheet surface) is assumed as a first axis, a direction vertical to a direction of an arrow A on a X-Y plane is assumed as a second axis, the direction of arrow A is assumed as a third axis, and the film is elongated in the direction of arrow A.

When an electric field is applied to piezoelectric film 8 from an upper part to a lower part in the first axis direction, as shown in FIG. 3, its symmetry is broken due to an effect of the helix structure of PLLA, so that piezoelectric film 8 deflects in a rotation direction, and shear piezoelectricity having a piezoelectric constant $d_{14}$ is generated. That is, since a point group of PLLA belongs to $D_2$, there are tensor components of $d_{14}$, $d_{25}$, and $d_{36}$, but equations such as $d_{25}=d_{14}$, and $d_{36}=0$ are established in elongated piezoelectric film 8. Therefore, piezoelectric film 8 elongates in almost the same direction as a first orthogonal line 13a, while piezoelectric film 8 shrinks in almost the same direction as a second orthogonal line 13b, so that piezoelectric film 8 deflects as shown by a solid line in FIG. 3.

Meanwhile, when an electric field is applied to piezoelectric film 10 from an upper part to a lower part in the first axis direction, as shown in FIG. 4, the piezoelectric film 10 shrinks in almost the same direction as a first orthogonal line 13c, while piezoelectric film 10 elongates in almost the same direction as a second orthogonal line 13d, so that piezoelectric film 10 deflects as shown by a solid line in FIG. 4.

Figure 5:
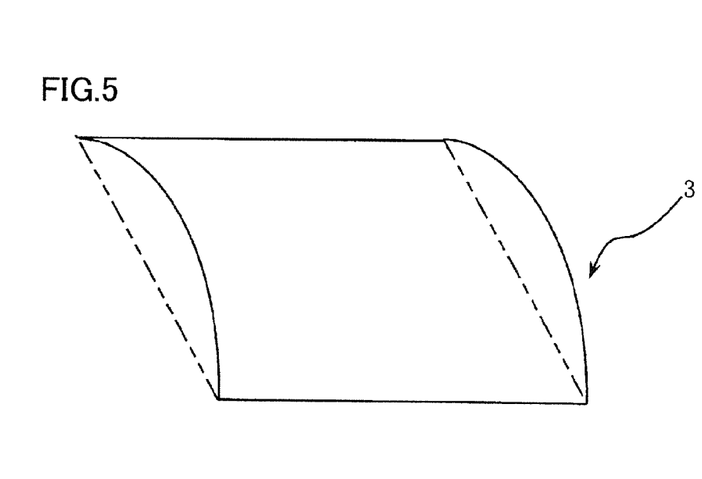
FIG. 5 is a view schematically showing a case where a voltage is applied to the piezoelectric speaker.

Therefore, when first piezoelectric body 7a and second piezoelectric body 7b are bonded through bonding agent 12, and the voltage is applied to electrodes 9a, 9b, 11a, and 11b so that first piezoelectric body 7a and second piezoelectric body 7b deform in opposite directions, the piezoelectric speaker 3 deflects from the phantom line to the solid line as shown in FIG. 5, and piezoelectric speaker 3 vibrates by alternating the voltage.

When each of piezoelectric films 8 and 10, electrodes 9a, 9b, 11a, and 11b, and bonding layer 12 is formed of a transparent material, a transparent piezoelectric speaker can be realized. In addition, when such transparent piezoelectric speaker is used, it becomes possible to obtain a thin and small-size liquid crystal television having no sound transmission hole and being superior in waterproof performance.

Furthermore, according to this embodiment, memory 5 stores the temperature dependency information of a piezoelectric constant $d_{14}$ serving as an index of an amount of displacement of piezoelectric speaker 3 when the voltage is applied, and the Young's modulus E serving as an index of an amount of deflection thereof when a stress is applied. Thus, as will be described below, even when piezoelectric constant $d_{14}$ and Young's modulus E of each of piezoelectric films 8 and 10 change due to a change in temperature, acoustic characteristics such as sound volume or frequency characteristics are controlled by MPU 4 so that they do not fluctuate as much as possible.

Meanwhile, each temperature dependency of piezoelectric constant $d_{14}$ and Young's modulus E of each of piezoelectric films 8 and 10 differs depending on the crystallinity degree, molar weight, purity, and method of orientation alignment of the piezoelectric polymer material serving as a raw material. That is, each of piezoelectric constant $d_{14}$ and Young's modulus E of each of piezoelectric films 8 and 10 has the temperature dependency which differs depending on the production method and production condition of the piezoelectric polymer material serving as the raw material.

The higher the piezoelectric constant is for the piezoelectric device such as the piezoelectric speaker according to this embodiment, the more preferable it is.

It is known that as main factors to increase the piezoelectric constant, it is required that the purity of PLLA is high and almost no PDLA is contained, the molar weight is high, the degree of orientation is high, the crystallinity is high, and a lamella crystal is large in size, and the piezoelectric constant differs depending on a configuration, quality, and characteristics of a final product. However, when the above cases are all realized in order to increase the piezoelectric constant, the cost could be increased, so that in practical use, it is preferable that the above requirements are appropriately implemented to the effect that the characteristics are not hampered with consideration of cost in order to increase the piezoelectric constant.

In addition, when the piezoelectric constant at room temperature is different, its temperature dependency is also different even when the same piezoelectric polymer material is used.

Figure 6:
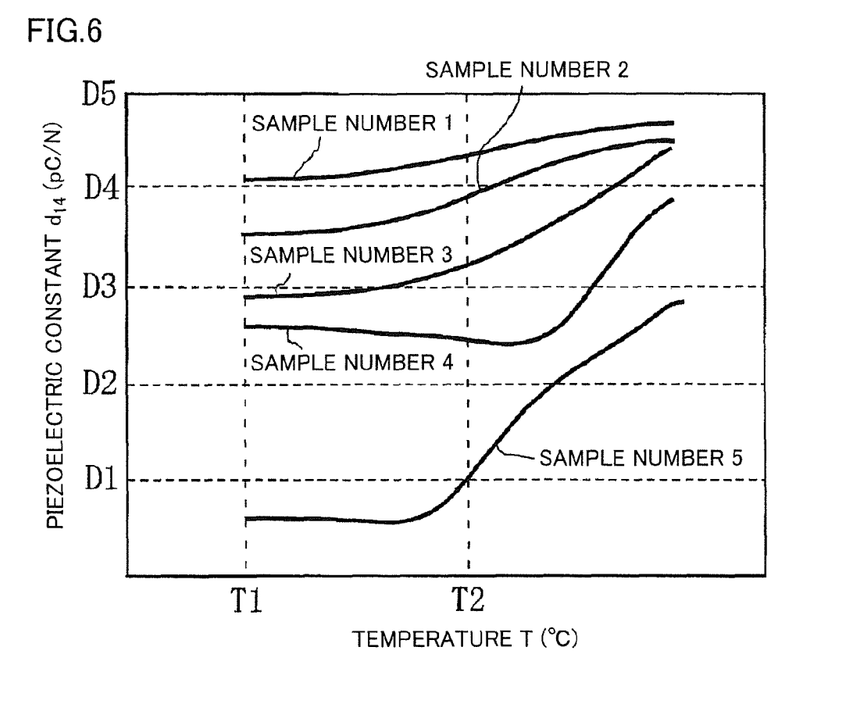
FIG. 6 is a view showing one example of temperature dependency of a piezoelectric constant $d_{14}$.

FIG. 6 shows one example of temperature dependency of piezoelectric constant $d_{14}$ of the piezoelectric film made of PLLA serving as the piezoelectric polymer material. A lateral axis shows a temperature T (° C.), and a longitudinal axis shows piezoelectric constant $d_{14}$ (pC/N). In the drawing, sample numbers 1 to 5 are products produced by different production methods and production conditions.

As can be clear from FIG. 6, when piezoelectric constant $d_{14}$ at room temperature of a temperature T1 (such as 20° C.) is high as in sample number 1, piezoelectric constant $d_{14}$ gently increases with a rise in temperature. However, it is likely that the lower piezoelectric constant $d_{14}$ at temperature T1 is, the larger the fluctuation range of piezoelectric constant $d_{14}$ with respect to a temperature change is, and when piezoelectric constant $d_{14}$ at temperature T1 is sufficiently low as in sample number 5, piezoelectric constant $d_{14}$ abruptly increases in a vicinity of a glass-transition temperature T2 (about 70° C.).

As described above, piezoelectric constant $d_{14}$ of each of piezoelectric films 8 and 10 has a specific temperature dependency according to the production method and the production condition even when the same piezoelectric polymer material is used.

Thus, when a constant drive voltage is applied, the amount of displacement of each of piezoelectric films 8 and 10 increases as piezoelectric constant $d_{14}$ increases, so that a sound volume also increases as piezoelectric constant $d_{14}$ increases.

That is, the piezoelectric constant $d_{14}$ fluctuates depending on the temperature as shown in FIG. 6, so that even when a constant drive voltage is applied to the signal speaker, the sound volume fluctuates depending on the temperature.

Meanwhile, the Young's modulus of each of piezoelectric films 8 and 10 also differs depending on a quality and characteristics of a final product, and similar to the piezoelectric constant, the temperature dependency of the Young's modulus is different when the Young's modulus at room temperature is different even when the same piezoelectric polymer material is used.

Figure 7:
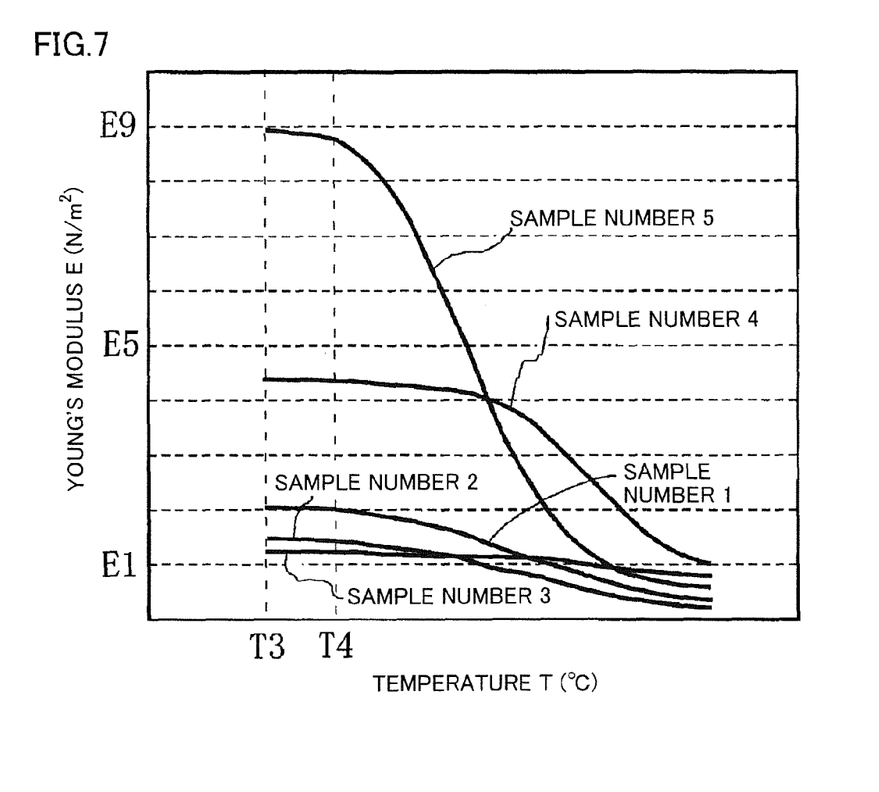
FIG. 7 is a view showing one example of temperature dependency of a Young's modulus E.

FIG. 7 shows one example of the temperature dependency of Young's modulus E of the piezoelectric film made of PLLA serving as the piezoelectric polymer material. A lateral axis shows a temperature T (° C.), and a longitudinal axis shows Young's modulus E (N/m$^2$). In the drawing, sample numbers 1 to 5 correspond to the sample numbers 1 to 5 in FIG. 6.

As can be clear from FIG. 7, when the Young's modulus E at room temperature of a temperature T3 (such as 20° C.) is low as in sample number 3, the Young's modulus E gently decreases. However, it is likely that the higher Young's modulus E at temperature T3 is, the larger is a fluctuation range of Young's modulus E with respect to a temperature change, and when Young's modulus E at temperature T3 is sufficiently high like the sample number 5, the Young's modulus E abruptly decreases at a relatively low temperature T4 (about 40° C.).

As described above, Young's modulus E of each of piezoelectric films 8 and 10 has the specific temperature dependency according to its production method and production condition, similar to piezoelectric constant $d_{14}$.

Thus, when Young's modulus E of each of piezoelectric films 8 and 10 increases in the case of piezoelectric speaker 3, it becomes hard and a sound quality is provided such that a reproduced frequency band seems to slightly shift to a high tone side. Meanwhile, when Young's modulus E of each of piezoelectric films 8 and 10 decreases, it becomes soft and a sound quality is provided such that the reproduced frequency band seems to slightly shift to a low tone side.

That is, Young's modulus E fluctuates depending on the temperature as shown in FIG. 7, so that the sound quality also fluctuates depending on the temperature.

In addition, even when the same piezoelectric polymer material is used, each of piezoelectric constant $d_{14}$ and Young's modulus E has the specific temperature dependency due to a difference in the production method and the production condition, as described above, but as is clear from FIGS. 6 and 7, there is no correlation between the temperature dependency of piezoelectric constant $d_{14}$ and the temperature dependency of Young's modulus E.

According to this embodiment, the temperature dependency information of piezoelectric constant $d_{14}$ and the temperature dependency information of Young's modulus E specific to piezoelectric speaker 3 are previously measured, and stored in memory 5. Thus, the ambient temperature from temperature sensor 6 is detected every predetermined time by a timer function incorporated in MPU 4, contents stored in memory 5 are compared with the detected temperature by correcting unit 4a of MPU 4, and the sound volume and the frequency characteristics to be outputted from piezoelectric speaker 3 are corrected, based on the ambient temperature, whereby the acoustic characteristics can be prevented from fluctuating as much as possible even when the temperature change is produced.

Hereinafter, an operation of this piezoelectric speaker system will be described in detail with reference to FIG. 1.

First, MPU 4 reads the temperature from temperature sensor 6 at predetermined times from a point at which a user sets the sound volume, or a power supply is turned on.

Meanwhile, sound source IC 1 sends the drive signal serving as the sound source to amplifier 2 through a signal line a. Then, MPU 4 compares the detected temperature from temperature sensor 6 with the temperature dependency information of piezoelectric constant $d_{14}$ and Young's modulus E previously stored in memory 5, and transmits a control signal provided based on the compared result to sound source IC 1 and amplifier 2 through a signal line c and a signal line d, whereby temperature correction is performed on the drive signal. For example, in a case where the temperature of the piezoelectric speaker system is 20° C. when the power supply is inputted, and the present temperature is 40° C., the temperature dependency information of piezoelectric constant $d_{14}$ is searched and when piezoelectric constant $d_{14}$ is high, the drive voltage is lowered to reach the desired sound volume, with consideration to the various components (such as size of piezoelectric speaker 3, thicknesses of piezoelectric films 8 and 10, electro-conductivities of electrodes 9a, 9b, 11a, and 11b, and volume of enclosure) previously stored in memory 5. In addition, the temperature dependency information of Young's modulus E is searched, and when Young's modulus E is low, the frequency characteristics is corrected so as to show desired acoustic characteristics, with consideration to the various components previously stored in memory 5.

Thus, the drive signal is inputted from amplifier 2 to piezoelectric speaker 3 through a signal line b, and piezoelectric speaker 3 generates the sound with the desired sound volume and the desired frequency characteristics, based on the drive signal from amplifier 2.

Thus, the first embodiment includes piezoelectric speaker 3 having piezoelectric bodies 7a and 7b provided by forming electrodes 9a, 9b, 11a, and 11b on both main surfaces of piezoelectric films 8 and 10 made of the piezoelectric polymer material, and sound source IC 1 and amplifier 2 for inputting the drive signal to piezoelectric speaker 3, and has memory 5 for storing each temperature dependency information of piezoelectric constant $d_{14}$ and Young's modulus E of piezoelectric speaker 3, and temperature sensor 6 for detecting the ambient temperature. Thus, correcting unit 4a corrects the drive signal of sound source IC 1 and amplifier 2, that is, the acoustic signal, based on each temperature dependency information of piezoelectric constant $d_{14}$ and Young's modulus E, and the detected result of temperature sensor 6, so that even when the device is used in a place exposed to the high temperature atmosphere such as in a bathroom or kitchen, it becomes possible to prevent the sound pressure level from excessively changing, or the frequency characteristics from deteriorating as much as possible. It therefore becomes possible to realize a thin and small-size piezoelectric speaker system from which the user can hear the sound with the desired volume and the preferable quality.

In addition, when a transparent material is used for the component members of the piezoelectric polymer material and the electrode material, a transparent piezoelectric speaker having no sound transmission hole can be obtained, and it can be preferably incorporated in the small-size liquid crystal television. Therefore, it becomes possible to realize a thin and small-size, and high-performance and high-quality piezoelectric speaker system having the desired acoustic characteristics even when a change is generated in the usage environmental temperature, and superiority in waterproof performance.

Moreover, above-described temperature sensor 6 detects the temperature of piezoelectric speaker 3 with high precision, so that it is preferably arranged in the vicinity of piezoelectric speaker 3.

Figure 8:
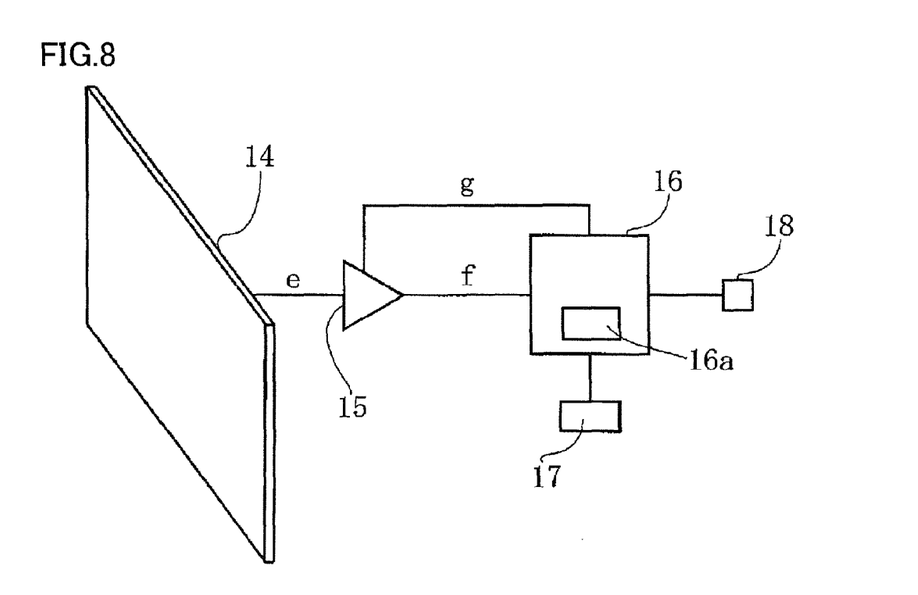
FIG. 8 is a system configuration diagram showing one example of a touch input system as a second embodiment of a piezoelectric device according to the present invention.

FIG. 8 is a system configuration diagram showing one example of a touch input system as a second embodiment of a piezoelectric device.

The touch input system includes a touch panel 14 (piezoelectric element) for generating a sensed signal (position information and press information) in response to pressed force, an amplifier 15 for amplifying the sensed signal inputted to touch panel 14, an MPU 16 for receiving the sensed signal from amplifier 15, a memory 17 for storing temperature dependency information of piezoelectric constant $d_{14}$ and Young's modulus E of touch panel 14 and a predetermined arithmetic program, and a temperature sensor 18 for detecting the ambient temperature when the system is driven.

Furthermore, MPU 16 has a correcting unit 16a, and performs a temperature correction on amplifier 15, based on a detected result of temperature sensor 18 and the temperature dependency information of piezoelectric constant $d_{14}$ and Young's modulus E.

Figure 9:
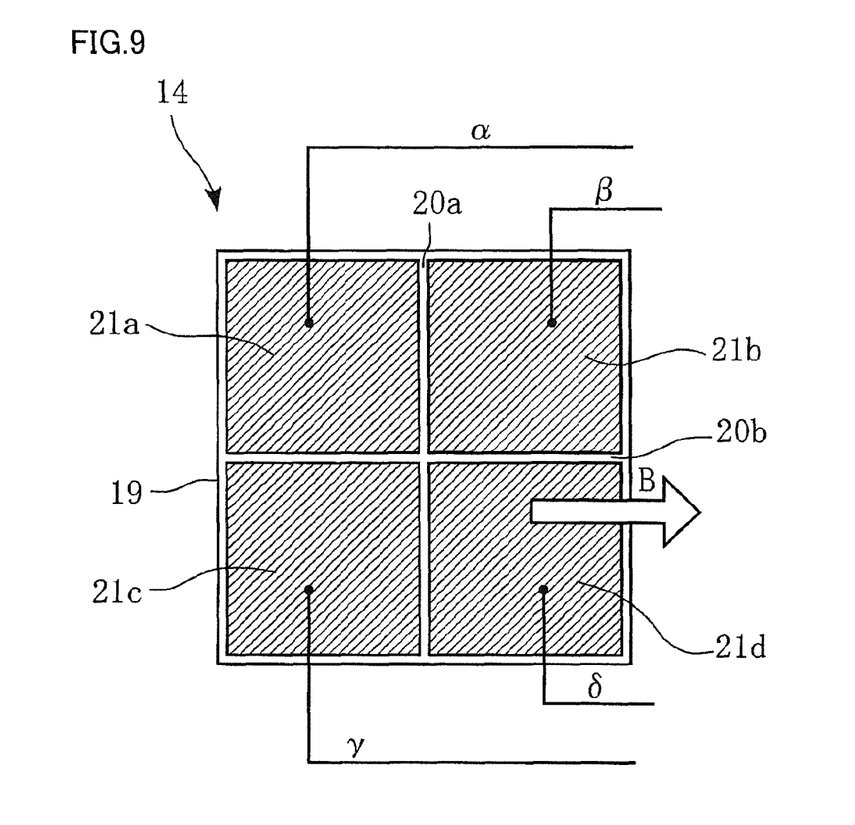
FIG. 9 is a plan view of a touch panel serving as a piezoelectric element.
Figure 10:
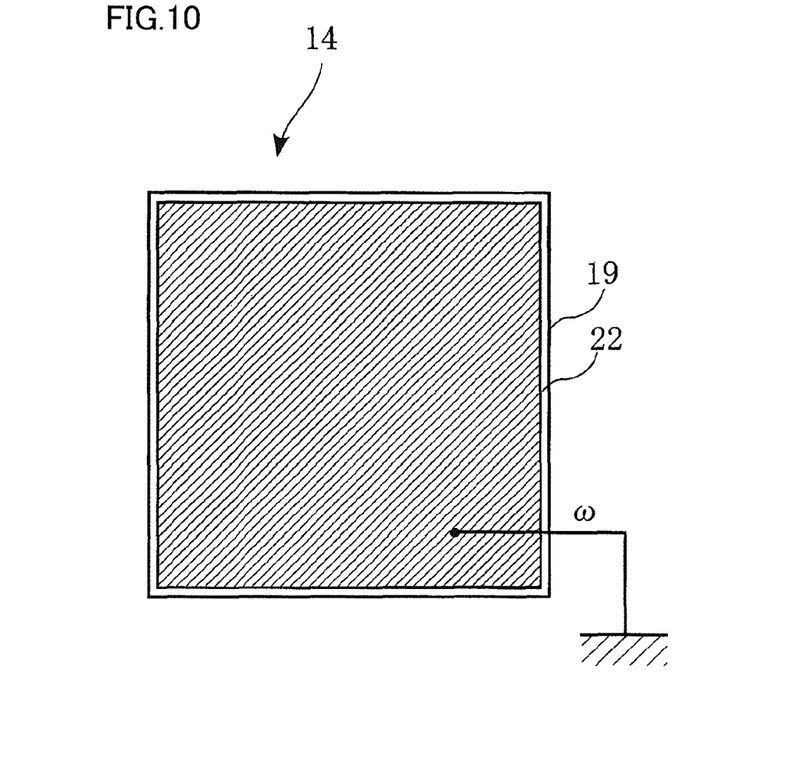
FIG. 10 is a bottom view of the touch panel.

FIG. 9 is a plan view schematically showing touch panel 14, and FIG. 10 is a bottom view schematically showing touch panel 14.

Touch panel 14 has a piezoelectric film 19 formed of the same piezoelectric polymer material as that in the first embodiment, and front surface electrodes (first to fourth surface electrodes 21a to 21d) which are separated across first and second electrode parting lines 20a and 20b are formed on one main surface of piezoelectric film 19. In addition, a uniform back surface electrode 22 is formed on the other main surface of piezoelectric film 19, and a signal line ω is set at a grounded potential.

Front surface electrodes 21a to 21d and back surface electrode 22 are connected to amplifier 15 through signal lines α to δ, and ω, and signal lines α to δ, and ω are collectively shown as signal line e in FIG. 8.

Next, a method for obtaining the position information and the press information of touch panel 14 will be described.

Figure 11:
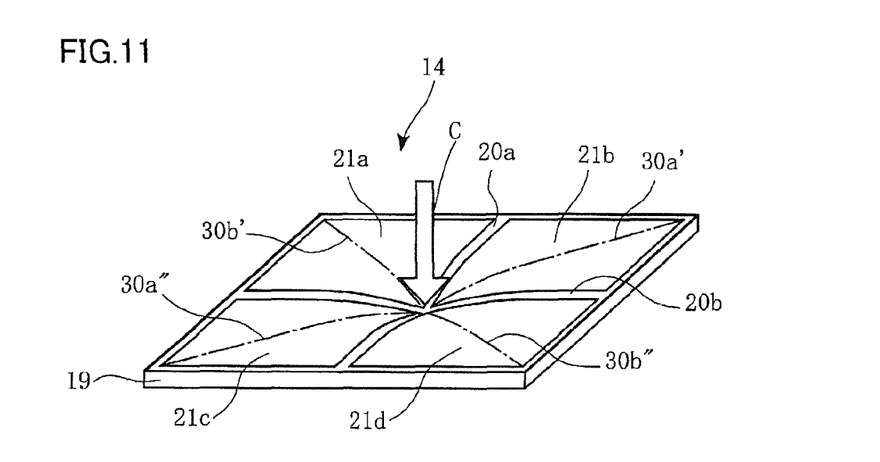
FIG. 11 is a view showing a state when the touch panel is pressed.

FIG. 11 shows a case where about the center position of touch panel 14 is pressed with predetermined pressed force.

As shown by an arrow C, when near the center position of touch panel 14 is pressed, piezoelectric film 19 is almost equivalently elongated in directions of orthogonal lines 30a', 30a", 30b', and 30b". That is, when orthogonal lines 30a' and 30a" are elongated, an electric field is generated in the normal direction in piezoelectric film 19 as shown in FIG. 3, and a plus potential is generated in each of second and third front surface electrodes 21b and 21c. In addition, orthogonal lines 30b' and 30b" are shrunken when the electric field is applied, but they are elongated when pressed, so that a minus potential is generated in each of first and fourth front surface electrodes 21a and 21d. Thus, a micro voltage is generated in each of the electrodes changes based on a change in pressed position. Thus, the pressed position can be sensed by analyzing a pattern of the generated potential.

As for the pressed force, similarly, by analyzing a voltage pattern obtained when touch panel 14 is pressed, the press information can be obtained.

Thus, according to the second embodiment, similar to the first embodiment, memory 17 stores temperature dependency information of each of piezoelectric constant $d_{14}$ and Young's modulus E of touch panel 14, and as a result, even when piezoelectric constant $d_{14}$ and Young's modulus E of touch panel 14 change due to the temperature change, the sensed voltage is corrected by correcting unit 16a so as to avoid a detection error.

That is, when touch panel 14 is pressed with a finger or pen, piezoelectric film 19 deflects and a micro voltage is generated, and the micro voltage is proportional to piezoelectric constant $d_{14}$ of piezoelectric film 19. Therefore, when piezoelectric constant $d_{14}$ fluctuates due to the temperature change, the pressed position could not be correctly detected. In addition, a deflection amount of piezoelectric film 19 changes due to a rise in temperature, so that the pressed force cannot be correctly sensed, causing a detection error.

However, according to the second embodiment, similar to the first embodiment, the temperature dependency information of piezoelectric constant $d_{14}$ and temperature dependency information of Young's modulus E specific to touch panel 14 are previously measured and stored in memory 17. The ambient temperature from temperature sensor 18 is detected at predetermined times by a timer function incorporated in MPU 16, contents stored in memory 17 are compared with the detected temperature by correcting unit 16a of MPU 16, and the position information and the press information to be inputted to touch panel 14 are corrected based on the ambient temperature, so that the sensing performance is prevented from reducing even when the temperature change is generated.

Hereinafter, an operation of this touch input system will be described in detail with reference to FIG. 8.

First, when touch panel 14 is pressed with a finger or pen, touch panel 14 generates a micro voltage, and its sensed signal is inputted to amplifier 15.

Meanwhile, MPU 16 reads the ambient temperature with temperature sensor 18 at predetermined times, and compares that temperature with the temperature dependency information of piezoelectric constant $d_{14}$ and Young's modulus E previously stored in memory 17. Then, MPU 16 sends a control signal based on the compared result to amplifier 15 through a signal line f, and amplifier 15 sends the temperature-corrected sensed signal to MPU 16 through a signal line g. For example, in a case where an initial temperature of touch panel 14 when pressed is 40° C., and then the temperature rises and a specific position of touch panel 14 is pressed at an ambient temperature of 42° C., when piezoelectric constant $d_{14}$ is higher and/or Young's modulus E is lower than the temperature dependency information of piezoelectric constant $d_{14}$ and Young's modulus E, the sensed voltage is corrected so that the desired position and the desired pressed force are provided, with consideration to the various components (such as size or thickness of touch panel 14) previously stored in memory 5, and then inputted to MPU 16.

The second embodiment includes touch panel 14 provided by forming front surface electrodes 21a to 21d and back surface electrode 22 on both main surfaces of piezoelectric film 19 made of the piezoelectric polymer material, and the pressing unit for inputting the position information and the press information to touch panel 14, has memory 17 for storing each temperature dependency information of piezoelectric constant $d_{14}$ and Young's modulus E of touch panel 14, and temperature sensor 18 for detecting the ambient temperature. Thus, correcting unit 16a corrects the position information and the press information on touch panel 14, based on the temperature dependency information of piezoelectric constant $d_{14}$ and Young's modulus E, and the detected result of temperature sensor 18, so that even when the deflection amount when pressed changes due to a change of the ambient temperature, the desired sensing performance can be provided, and it becomes possible to prevent the detection error as much as possible. Even when the usage environmental temperature fluctuates, the position information and the press information can be correctly obtained, so that the high-performance touch input system whose reliability is improved can be realized.

In addition, above-described temperature sensor 18 can detect the temperature of touch panel 14 with high precision, so that it is preferably arranged in the vicinity of touch panel 14.

Figure 12:
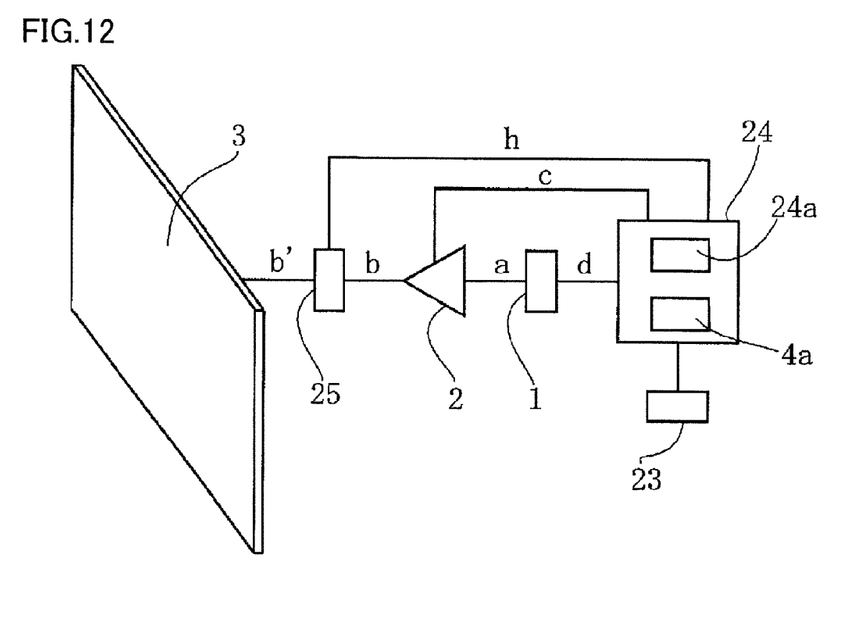
FIG. 12 is a system configuration diagram showing another example of a piezoelectric speaker system serving as a third embodiment of a piezoelectric device according to the present invention.

FIG. 12 is a system configuration diagram of a piezoelectric speaker system showing a third embodiment as a piezoelectric device.

According to the third embodiment, the temperature of piezoelectric speaker 3 is detected based on electrostatic capacitance of piezoelectric speaker 3 measured by an MPU 24 instead of temperature sensor, and temperature characteristic information of the electrostatic capacitance which is previously measured and stored in a memory 23.

That is, the piezoelectric polymer material is a dielectric body, and piezoelectric speaker 3 forms a capacitor on a circuit by forming electrodes 9a, 9b, 11a, and 11b on both main surfaces of piezoelectric films 8 and 10. In addition, the piezoelectric polymer material is high in linear expansion coefficient in general, so that the thickness and size of each of piezoelectric films 8 and 10 change subtly based on the temperature.

Thus, according to the third embodiment, the temperature of piezoelectric speaker 3 is detected based on the electrostatic capacitance of piezoelectric speaker 3 measured by MPU 24, and the temperature characteristics of the electrostatic capacitance are stored in memory 23, and a sound volume and a sound quality are corrected based on the detected temperature and each temperature dependency information of piezoelectric constant $d_{14}$ and Young's modulus E of piezoelectric speaker 3.

That is, this piezoelectric speaker system is provided with piezoelectric speaker 3, sound source IC 1, and amplifier 2, similar to the first embodiment. In addition to each temperature dependency information of piezoelectric constant $d_{14}$ and Young's modulus E, memory 23 also stores temperature dependency information of the electrostatic capacitance specific to piezoelectric speaker 3. In addition, MPU 24 includes measuring unit 24a for measuring the electrostatic capacitance of piezoelectric speaker 3 in addition to above-described correcting unit 4a. Furthermore, measuring unit 24a has an execution mode and a non-execution mode, and a switch unit 25 is interposed between piezoelectric speaker 3 and amplifier 2, so that MPU 24 controls switch unit 25 based on the execution mode and the non-execution mode. That is, MPU 24 controls switching unit 25 through a signal line h so that the drive signal is prohibited from being outputted from amplifier 2 to piezoelectric speaker 3 in the execution mode, and the drive signal is allowed to be outputted from amplifier 2 to piezoelectric speaker 3 in the non-execution mode.

Hereinafter, an operation of the piezoelectric speaker system of the third embodiment will be described in detail.

When measuring unit 24a is set in the execution mode, the electrostatic capacitance of piezoelectric speaker 3 is measured, the temperature dependency information of the electrostatic capacitance stored in memory 23 is searched, and the temperature corresponding to the electrostatic capacitance measured by measuring unit 24a is read, whereby the temperature of piezoelectric speaker 3 is detected.

Meanwhile, when measuring unit 24a is set in the non-execution mode, similar to the first embodiment, MPU 24 compares each temperature dependency information of piezoelectric constant $d_{14}$ and Young's modulus E with the temperature of piezoelectric speaker 3 detected in the execution mode, and transmits the control signal to amplifier 2 through signal line c, and the temperature correction is performed on the drive signal in amplifier 2. Then, amplifier 2 supplies the temperature-corrected drive signal to piezoelectric speaker 3 through signal lines b and b', and piezoelectric speaker 3 generates sound based on the drive signal.

According to the third embodiment described above, similar to the first embodiment, temperature correction is performed on the drive signal based on the ambient temperature, so that the sound volume and the sound quality having the desired acoustic characteristics can be obtained.

Since the temperature sensor is not needed, it becomes possible to realize the high-quality piezoelectric speaker system capable of preventing the acoustic signal from changing even when the usage environmental temperature changes at low cost.

In the third embodiment, switch 25 switches between the execution mode and the non-execution mode based on a command from MPU 24, and controls the output of the drive signal to piezoelectric speaker 3, but the measurement of the electrostatic capacitance can be instantaneously performed by measuring unit 24a, so that the temperature correction can be sequentially performed when piezoelectric speaker 3 is driven.

Figure 13:
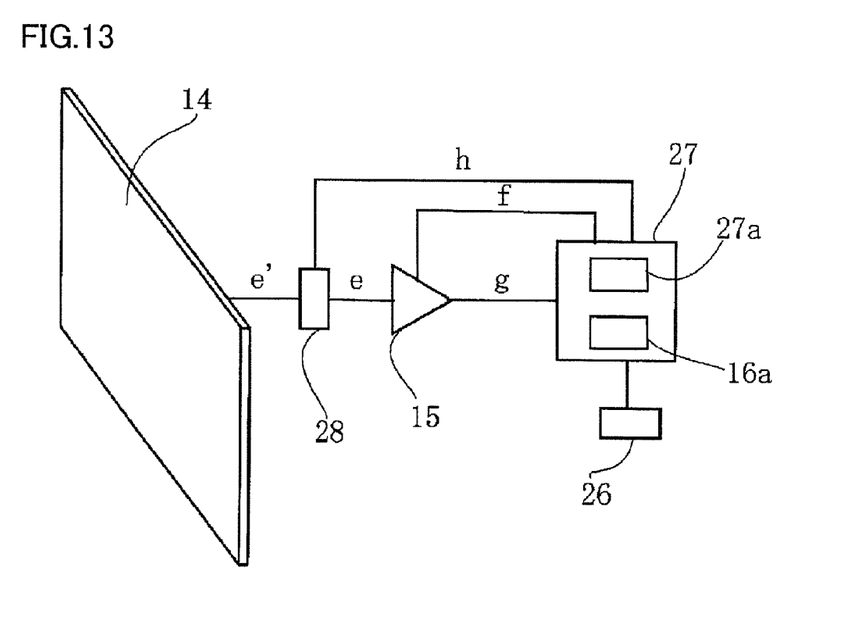
FIG. 13 is a system configuration diagram showing another example of a touch input system as a fourth embodiment of a piezoelectric device according to the present invention.

FIG. 13 is a system configuration diagram of a touch input system showing a fourth embodiment as a piezoelectric device, and the fourth embodiment shows a case where the third embodiment is applied to the touch input system.

That is, the touch input system is provided with touch panel 14 and amplifier 15 similar to the second embodiment. In addition to the temperature dependency information of piezoelectric constant $d_{14}$ and Young's modulus E, a memory 27 stores the temperature dependency information of the electrostatic capacitance specific to touch panel 14. In addition, an MPU 27 includes measuring unit 27a for measuring the electrostatic capacitance of touch panel 14 in addition to above-described correcting unit 16a. Furthermore, measuring unit 27a has an execution mode and non-execution mode, and switch 28 is interposed between touch panel 14 and amplifier 15, so that MPU 27 controls switch unit 28 based on the execution mode and the non-execution mode. That is, MPU 27 controls switch unit 28 through signal line h so that the sensed signal is prohibited from being inputted from touch panel 14 to amplifier 15 in the execution mode, while the sensed signal is allowed to be inputted from touch panel 14 to amplifier 15 in the non-execution mode.

Hereinafter, an operation of the touch input system of the fourth embodiment will be described in detail.

When measuring unit 27a is set in the execution mode, the electrostatic capacitance of touch panel 14 is measured, the temperature dependency information of the electrostatic capacitance stored in memory 26 is searched, and the temperature corresponding to the electrostatic capacitance measured by measuring unit 27a is read, whereby the temperature of touch panel 14 is detected.

Meanwhile, when measuring unit 27a is set in the non-execution mode, similar to the second embodiment, the sensed signal is inputted from touch panel 14 to amplifier 15 through signal lines e' and e. Then, MPU 27 compares temperature dependency information of each of the piezoelectric constant $d_{14}$ and Young's modulus E with the temperature of touch panel 14, and transmits the control signal to amplifier 15 through signal line f, and the temperature correction is performed on the sensed signal in amplifier 15. Then, the temperature-corrected sensed signal is transmitted to MPU 27.

According to the fourth embodiment, similar to the second embodiment, the temperature correction is performed on the sensed signal based on the ambient temperature, so that sensing characteristics having the desired position information and press information can be obtained.

In addition, similar to the third embodiment, the temperature sensor is not needed and it becomes possible to realize the high-quality touch input system capable of enduring the high-temperature atmosphere at low cost.

According to the fourth embodiment, switch 28 switches between the execution mode and the non-execution mode based on a command from MPU 27, and controls the input of the drive signal from touch panel 14, but the measurement of the electrostatic capacitance can be instantaneously performed by measuring unit 27a, so that the temperature correction can be sequentially performed when touch panel 14 is pressed.

The present invention is not limited to the above embodiments. As the piezoelectric polymer material, PLLA is preferably used as described above, but the material is not limited to PLLA, and other piezoelectric polymer material such as PVDF may be similarly used. In this case also, a memory stores the temperature dependency information of piezoelectric constant $d_{14}$ and Young's modulus E of the used piezoelectric polymer material, and the temperature dependency information of the electrostatic capacitance thereof when needed, and the sound volume and the sound quality are corrected based on the temperature change in the case of the piezoelectric speaker system, or the sensing performance is corrected based on the temperature change in the case of the touch input system, so that the performance can be prevented from deteriorating.

In addition, the piezoelectric speaker system and the touch input system have been illustrated as the piezoelectric device in the above description of the embodiment, but the present invention is not limited to those embodiments. Since the piezoelectric constant $d_{14}$ and Young's modulus E of the piezoelectric polymer material fluctuate and the amount of displacement fluctuates due to the rise in temperature, it is necessary to perform the temperature correction in order to ensure the desired performance and quality, so that the present invention can be widely applied to various piezoelectric devices using the piezoelectric polymer material.

In addition, the method for obtaining the position information and the press information in the touch input system is also not limited to the above embodiments, and various methods may be used.

INDUSTRIAL APPLICABILITY

Various kinds of piezoelectric devices, such as a piezoelectric speaker system and a touch input system, capable of obtaining preferable acoustic characteristics and sensing characteristics can be realized even when they are used in a high ambient temperature such as in a bathroom or kitchen, or the usage atmospheric temperature changes.

REFERENCE SIGNS LIST

1 Sound source IC (inputting unit)
3 Piezoelectric speaker (piezoelectric element)
4a Correcting unit
5 Storing unit
6 Temperature sensor (temperature detecting unit)
7a, 7b Piezoelectric body
8 Piezoelectric film
9a, 9b Electrode
10 Piezoelectric film
11a, 11b Electrode
14 Touch panel (piezoelectric element)
15 Amplifier
16a Correcting unit
17 Storing unit
18 Piezoelectric film
19 Temperature sensor (temperature detecting unit)
21a to 21d Front surface electrode (electrode)
22 Back surface electrode (electrode)
23 Storing unit
24a Measuring unit
25 Switching unit
26 Storing unit
27a Measuring unit
28 Switching unit

The invention claimed is:
1. A piezoelectric device comprising:
a piezoelectric element comprising at least one piezoelectric body comprising a piezoelectric polymer film having electrodes on both main surfaces thereof;
an inputting unit for inputting predetermined information to said piezoelectric element;
a memory for storing temperature dependency information comprising a piezoelectric constant and a Young's modulus of said piezoelectric polymer film, and electrostatic capacitance of said piezoelectric element;

a measuring unit for measuring the electrostatic capacitance of said piezoelectric element, said measuring unit having an execution mode and a non-execution mode;

a correction unit for correcting said input information based on said temperature dependency information and said electrostatic capacitance measured by said measuring unit; and a switch for switching between said execution mode of said measuring unit and said non-execution mode of said measuring unit, wherein when said measuring unit is set in said execution mode, the measurement unit measures the electrostatic capacitance of said piezoelectric element and said correction unit determines a temperature of said piezoelectric element based on a measured result of said measuring unit and the temperature dependency information of said electrostatic capacitance, and wherein when said measuring unit is set in said non-execution mode, said correcting unit corrects said input information based on the determined temperature and said temperature dependency information.

2. The piezoelectric device according to claim 1, wherein said inputting unit comprises a sound source unit accumulating a sound source, and said input information comprises an acoustic signal, and said correction unit corrects the acoustic signal based on the detected temperature and the temperature dependency information of an amount of displacement when a voltage is applied and an amount of deflection when a stress is applied in said piezoelectric element.

3. The piezoelectric device according to claim 1, wherein said inputting unit comprises a pressing unit for applying pressure to a specific position of said piezoelectric element, and said input information includes position information and pressure information, and said correction unit corrects said position information and said pressure information based on the detected temperature and temperature dependency information of an amount of displacement when a voltage is applied and an amount of deflection when a stress is applied in said piezoelectric element.

4. The piezoelectric device according to claim 1, wherein said piezoelectric element includes a piezoelectric speaker.

5. The piezoelectric device according to claim 1, wherein an electrode formed on at least one main surface is divided into a plurality of regions.

6. The piezoelectric device according to claim 1, wherein the piezoelectric element includes a touch panel.

7. The piezoelectric device according to claim 1, wherein said piezoelectric polymer material comprises poly-lactic acid.

* * * * *